United States Patent [19]
Ko et al.

[11] Patent Number: 6,080,673
[45] Date of Patent: Jun. 27, 2000

[54] CHEMICAL MECHANICAL POLISHING METHODS UTILIZING PH-ADJUSTED POLISHING SOLUTIONS

[75] Inventors: Yong-sun Ko; Chang-ki Hong, both of Kyungki-do, Rep. of Korea

[73] Assignee: Samsung Electronics Co., Ltd., Rep. of Korea

[21] Appl. No.: 09/010,329

[22] Filed: Jan. 21, 1998

[30] Foreign Application Priority Data

May 7, 1997 [KR] Rep. of Korea .................. 97-17404

[51] Int. Cl.[7] ............................................... H01L 21/302
[52] U.S. Cl. .......................... 438/692; 438/690; 438/691; 438/693; 216/887; 216/89
[58] Field of Search .................................. 438/690, 691, 438/692, 693; 216/88, 89

[56] References Cited

U.S. PATENT DOCUMENTS

| | | | |
|---|---|---|---|
| 5,320,706 | 6/1994 | Blackwell | 438/693 |
| 5,407,526 | 4/1995 | Danielson et al. | 438/693 |
| 5,597,443 | 1/1997 | Hempel | 438/693 |
| 5,643,406 | 7/1997 | Shimomura et al. | 438/693 |
| 5,769,689 | 6/1998 | Cossaboon et al. | 451/41 |

FOREIGN PATENT DOCUMENTS

| | | |
|---|---|---|
| 8-107094 | 4/1996 | Japan . |
| 8-339981 | 12/1996 | Japan . |

OTHER PUBLICATIONS

Ali et al.; The Effect of Secondary Platen Downforce on Post–Chemical Mechanical Planarization Cleaning; *Microcontamination Conference Proceedings;* (1994); pp. 196–205.

*Primary Examiner*—Carl Whitehead, Jr.
*Assistant Examiner*—Jamie L. Davis
*Attorney, Agent, or Firm*—Myers Bigel Sibley & Sajovec, P.A.

[57] ABSTRACT

Methods for manufacturing microelectronic using chemical mechanical polishing (CMP) comprises providing wafers wetted with deionized water mixtures having first pHs, and performing CMP on the wetted wafers while applying polishing slurries having second pHs thereto. In accordance with the invention, the first pHs are substantially equal to the second pHs.

17 Claims, 1 Drawing Sheet

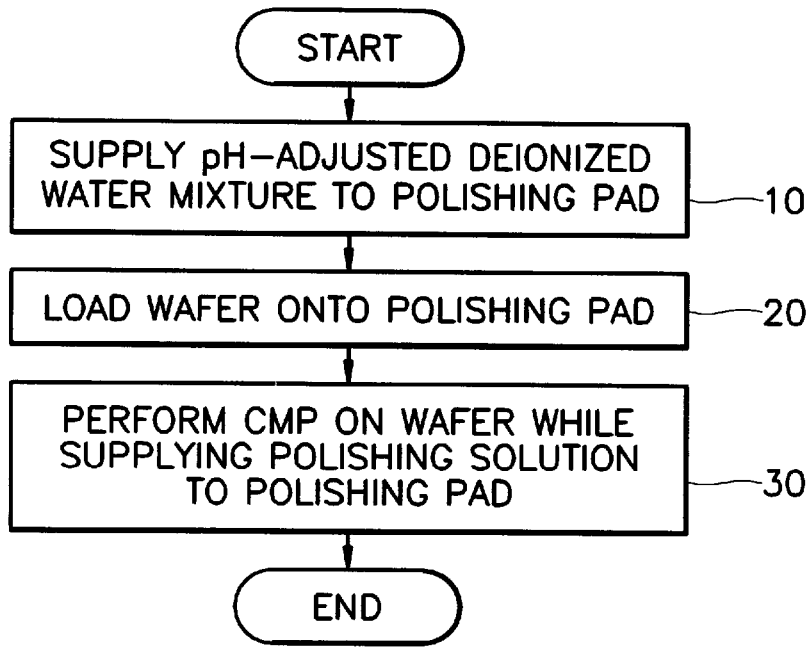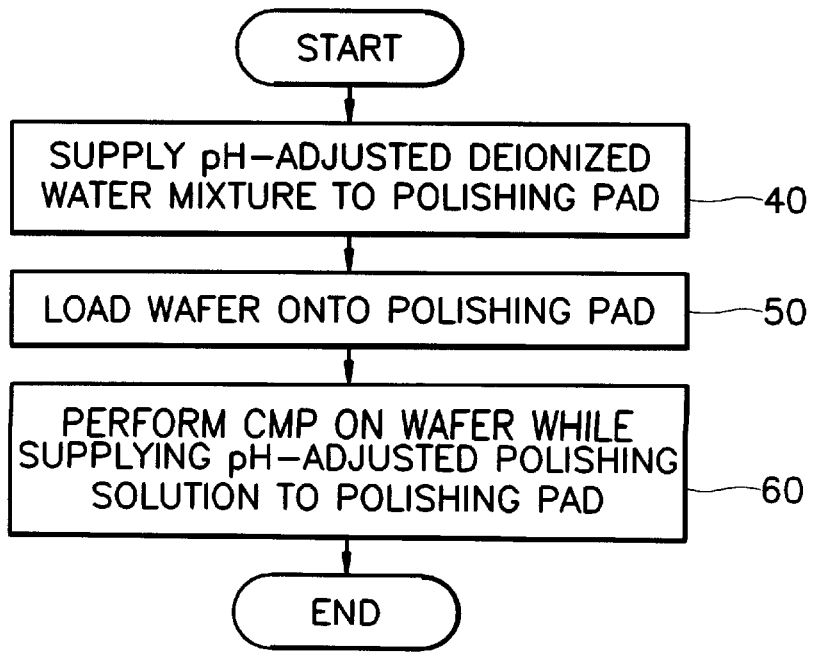

CHEMICAL MECHANICAL POLISHING METHODS UTILIZING PH-ADJUSTED POLISHING SOLUTIONS

FIELD OF THE INVENTION

The invention generally relates to the manufacture of microelectronic devices.

BACKGROUND OF THE INVENTION

Chemical mechanical polishing (CMP) methods are typically used in a number of aspects such as, for example, interlayer planarization in multi-layer wiring processes, shallow trench isolation of transistors, and the manufacture of silicon substrates or the manufacture of silicon on insulator (SOI) substrates. A target material which may be employed for use with a CMP method may contain one or more elements such as, for example, silicon (Si), silicon dioxide ($SiO_2$), aluminum (Al), tungsten (W), and copper (Cu). The slurry which is used in a CMP process is usually selected according to the element or elements used as the target material. For example, if the target is an insulation layer containing a nitride or an oxide, an alkaline slurry is typically used. If the target material is formed from metal, it is generally preferable to use a weak acidic slurry.

Prior to carrying out the CMP step, deionized water is usually supplied to a polishing pad which has been wetted with deionized water or slurry. A wafer which is to be used in a micrelectronic (e.g., semiconductor) device is present on the polishing pad. The wafer may be polished by supplying polishing solution to the surface of the polishing pad, and applying the polishing solution to the wafer.

In attempting to polish the target, it is preferable to select a specific polishing solution based on the characteristics of the target. For example, when the target is an oxide layer, silica is typically used as a polishing agent. In this instance, an undiluted slurry solution which includes silica may be mixed with deionized water in a predetermined ratio, e.g., 1:1. The mixture may then be used as a polishing solution.

In general, there is often a difference in pH between the polishing solution and the deionized water used to wet the polishing pad. The pH of the polishing solution is typically alkaline (approximately 10–11) and the pH of the deionized water is usually neutral, i.e., 7. The difference in pH may be potentially disadvantageous in that the silica may coagulate to form abnormally large particles. As a result, the surface of the oxide layer may become damaged (e.g., $\mu$-scratched) by virtue of the presence of the coagulated silica. This could be especially harmful in shallow trench isolation formation processes since active and non-active regions of semiconductor devices may become damaged. Thus, gate oxide layers and gate electrode lines could become adversely effected.

It is therefore an object of the present invention to provide methods of manufacturing microelectronic devices using chemical mechanical polishing techniques which address the difficulties described above.

SUMMARY OF THE INVENTION

To this end and others, in one aspect, the present invention provides methods for manufacturing microelectronic (e.g., semiconductor) devices using chemical mechanical polishing (CMP) techniques. The methods comprise providing wafers wetted with deionized water mixtures having first pHs, and performing CMP on the wetted wafers while applying thereto polishing slurries having second pHs substantially equal to the first pHs.

In another aspect, the invention provides methods for manufacturing microelectronic devices using CMP. The methods comprise providing wafers wetted with deionized water mixtures having first pHs, and performing CMP on the wetted wafers while applying thereto polishing slurries having second pHs substantially equal to the first pHs. The second pHs are adjusted during CMP.

BRIEF DESCRIPTION OF THE DRAWINGS

FIG. 1 is a flowchart illustrating a chemical mechanical polishing (CMP) method according to an embodiment of the invention; and FIG. 2 is a flowchart illustrating a CMP method according to another embodiment of the invention.

DETAILED DESCRIPTION OF THE PREFERRED EMBODIMENTS

The present invention now will be described more fully hereinafter with reference to the preferred embodiments of the invention, and drawings illustrating the embodiments. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In one aspect, the invention. provides methods for manufacturing microelectronic device using chemical mechanical polishing (CMP) techniques. The methods comprise providing wafers wetted with deionized water mixtures having first pHs. CMP is then performed on the wetted wafers while applying thereto polishing slurries having second pHs. The slurries typically comprise silica particles. In accordance with the invention, the first pHs are substantially equal to the second pHs.

Typically, the deionized water mixtures are formed by mixing deionized water with pH-adjusting reagents. The pH-adjusting reagents are usually selected from the groups consisting of alkaline pH-adjusting reagents and acidic pH-adjusting reagents. These reagents are known to those who are skilled in the art. As an example, the alkaline pH-adjusting reagents may be selected from potassium hydroxide, ammonium hydroxide, and mixtures thereof. Examples of acidic pH-adjusting reagents include, but are not limited to, $H_2O_2$, $CH_3COOH$, citric acid, phosphoric acid, and mixtures thereof.

In certain embodiments, the polishing solutions may be alkaline polishing slurries. In such instances, the first pHs are substantially equal to or greater than the second pHs. It is preferred in these embodiments that the deionized water mixtures comprise alkaline pH-adjusting reagents.

In a second aspect, the invention provides methods of manufacturing microelectronic devices using CMP. The methods comprise providing wafers wetted with deionized water mixtures having first pHs. Subsequently, CMP is performed on the wetted wafers while applying thereto polishing slurries having second pHs. In these embodiments, the first pHs are substantially equal to the second pHs and the second pHs adjusted during the CMP. The deionized water mixtures may be formed by mixing deionized water with pH-adjusting reagents such as, for example, those mentioned herein. The above methods may further include the step of mixing deionized water with undiluted slurry solutions at predetermined ratios to form the polishing slurries. Preferably, deionized water and the undiluted slurry solutions are mixed at a 1:1 volume ratio. In these instances, the polishing slurries may be alkaline polishing slurries. Accordingly, the first pHs of the deionized water mixtures are substantially equal to or greater than the second pHs. The second pHs of the polishing slurries may be adjusted during the CMP. In general, the first pHs being substantially equal to or higher than the second pHs are able to minimize coagulation problems associated with the deionized water mixtures having pHs which are too low.

The invention will now be described in greater detail with reference to the drawings. FIG. 1 sets forth a CMP method illustrating one embodiment of the invention. As illustrated, a polishing pad, used for physically polishing a wafer, is wetted with a deionized water mixture (step 10). In this instance, the pH of the deionized water mixture supplied to the polishing pad is adjusted to be equal or substantially equal to the pH of the polishing slurry which is subsequently applied. The pH of the deionized water mixture may be adjusted by using a pH-adjusting reagent. Typically, the pH-adjusting reagent is mixed with deionized water prior to applying it to the polishing pad. In the event that an alkaline polishing slurry is used, it is preferable to use an alkaline reagent such as the pH-adjusting reagent. If an acidic polishing solution is used, it is preferable to use an acidic reagent as the pH-adjusting reagent.

A polishing slurry containing silica typically has a pH of approximately between 10 and 11. In such an instance, it is preferable to use an alkaline reagent such as, for example, potassium hydroxide or ammonium hydroxide, to adjust the pH of the deionized water to be substantially equal to the pH of the polishing slurry (between 10 and 11). As an alternative, the pH of the deionized water may be adjusted to be higher than that of the polishing slurry so as to achieve a desired effect.

Subsequently, a wafer to be polished is loaded onto a polishing pad. The wafer is preferably wetted with the deionized water mixture (step 20). A CMP process is then performed on the wafer during which time polishing slurry is supplied to the polishing pad at a location below the wafer (step 30).

The embodiment illustrated in FIG. 1 is advantageous in that coagulation of silica particles in the polishing slurry is potentially minimized due to the similarity in pH levels between the deionized water mixture and the polishing slurry.

Referring now to FIG. 2, a flowchart is provided which illustrates another embodiment of a CMP process in accordance with the present invention. In this example, similar to the embodiment illustrated in FIG. 1, a deionized water mixture is supplied to the polishing pad (step 40). Next, a wafer which has been wetted with the deionized water mixture is loaded onto the polishing pad (step 50). Thereafter, a CMP process is performed on the wafer while a polishing slurry is supplied to the pad. The pH of the polishing slurry is adjusted during this step to minimize slurry coagulation (step 60).

In the event that the above polishing slurry contains silica, the polishing slurry can be prepared according to the following technique. First, the pH of the deionized water is adjusted by using a pH-adjusting reagent to be substantially equal to the pH of an undiluted slurry solution which contains silica. Next, the resulting pH-adjusted deionized water mixture is mixed with the undluted slurry solution at a predetermined volume ratio such as, for example 1:1, to prepare a polishing slurry.

In accordance with the embodiment described in FIG. 2, the deionized water mixture is supplied to the polishing pad prior to carrying out the CMP. When the CMP is carried out, the polishing slurry is supplied to the polishing pad in order to minimize particle coagulation. Although not intending to be bound by any theory, it is believed that coagulation may be attributable to the pH difference between: (1) the undiluted slurry solution and the deionized water contained in the polishing slurry and (2) the polishing slurry and the deionized water mixture which is supplied to the polishing pad.

The invention offers potential advantage. More specifically, minimal coagulation may be experienced by adjusting: (1) the pH of the polishing slurry and the pH of deionized water supplied to the polishing pad during CMP, or (2) the pH of the undiluted slurry solution and the deionized water, each of which are to be included in the polishing slurry, such that these components have substantially the same pH values. As a result, the surface of the target which is polished may experience minimal damage, e.g., $\mu$-scratching.

In the specification and examples, there have been disclosed typical preferred embodiments of the invention and, although specific terms are employed, they are used in a generic and descriptive sense only and not for the purposes of limitation, the scope of the invention being set forth in the following claims.

That which is claimed:

1. A method for manufacturing a microelectronic device using chemical mechanical polishing (CMP), said method comprising:

providing a wafer wetted with a deionized water mixture having a first pH, said deionized water mixture comprising deionized water and a pH-adjusting reagent; and performing CMP on the wetted wafer while applying thereto a polishing slurry having a second pH substantially equal to the first pH such that particle coagulation in the polishing slurry is minimized and the microelectronic device experiences minimal damage.

2. A method according to claim 1, wherein the deionized water mixture having the first pH is formed by mixing deionized water with a pH-adjusting reagent.

3. A method according to claim 1, wherein the pH-adjusting reagent is selected from the group consisting of an alkaline pH-adjusting reagent and an acidic pH-adjusting reagent.

4. A method according to claim 3, wherein the alkaline pH-adjusting reagent is selected from the group consisting potassium hydroxide, ammonium hydroxide, and mixtures thereof.

5. A method for manufacturing a microelectronic device using chemical mechanical polishing (CMP), said method comprising:

providing a wafer wetted with a deionized water mixture having a first pH, said deionized water mixture comprising a pH-adjusting reagent and deionized water; and performing CMP on the wetted wafer while applying thereto an alkaline polishing slurry having a second pH, wherein the first pH is substantially equal to or greater than the second pH such that particle coagulation in the polishing slurry is minimized and the microelectronic device experiences minimal damage.

6. A method according to claim 5, wherein the deionized water mixture having the first pH is formed by mixing deionized water with an alkaline pH-adjusting reagent.

7. A method according to claim 6, wherein the alkaline pH-adjusting reagent is selected from the group consisting potassium hydroxide, ammonium hydroxide, and mixtures thereof.

8. A method for manufacturing a microelectronic device using chemical mechanical polishing (CMP), said method comprising:

provided a wafer wetted with a deionized water mixture having a first pH, said deionized water mixture comprising deionized water and a pH-adjusting reagent; and performing CMP on the wetted wafer while applying thereto a polishing slurry having a second pH substantially equal to the first pH, the polishing slurry comprising silica, deionized water, and a pH-adjusting reagent, and wherein the second pH is adjusted during CMP such that particle coagulation in the polishing slurry is minimized and the microelectronic device experiences minimal damage.

9. A method according to claim 8, wherein the deionized water mixture is formed by mixing deionized water with a pH-adjusting reagent.

10. A method according to claim 9, wherein the pH-adjusting reagent is selected from the group consisting of an alkaline pH-adjusting reagent and an acidic pH-adjusting reagent.

11. A method according to claim 10, wherein the alkaline pH-adjusting reagent is selected from the group consisting potassium hydroxide, ammonium hydroxide, and mixtures thereof.

12. A method according to claim 8, wherein the polishing slurry comprises a mixture of the deionized water and an undiluted slurry solution mixed at a 1:1 volume ratio.

13. A method for manufacturing a microelectronic device using chemical mechanical polishing (CMP), said method comprising:

provided a wafer wetted with a deionized water mixture having a first pH, said deionized water mixture comprising deionized water and a pH-adjusting reagent; and performing CMP on the wetted wafer while applying thereto an alkaline polishing slurry having a second pH, wherein the first pH is substantially equal to or greater than the second pH, the alkaline polishing slurry comprising silica, deionized water, and a pH-adjusting reagent, and wherein the second pH is adjusted during CMP such that particle coagulation in the polishing slurry is minimized and the microelectronic device experiences minimal damage.

14. A method according to claim 13, wherein the deionized water mixture having the first pH is formed by mixing deionized water with a pH-adjusting reagent.

15. A method according to claim 14, wherein the pH-adjusting reagent is an alkaline pH-adjusting reagent.

16. A method according to claim 15, wherein the alkaline pH-adjusting reagent is selected from the group consisting potassium hydroxide, ammonium hydroxide, and mixtures thereof.

17. A method according to claim 13, wherein the alkaline polishing slurry comprises a mixture of the deionized water and an undiluted slurry solution mixed at a 1:1 volume ratio.

* * * * *